United States Patent
Koeber et al.

(10) Patent No.: US 10,775,455 B2
(45) Date of Patent: Sep. 15, 2020

(54) POWER MANAGEMENT FOR CRYOGEN COMPRESSORS

(71) Applicants: Siemens Healthcare Limited, Camberley (GB); SIEMENS HEALTHCARE GmbH, Erlangen OT (DE)

(72) Inventors: Felix Michael Koeber, Erlangen (DE); Rolf Heinrichs, Roettenbach (DE); Adrian Bampton, Eynsham (GB); Philip Alan Charles Walton, Witney (GB); Dhavalkumar Patel, Eynsham (GB); John Anthony Robert Teah, Hermitage (GB)

(73) Assignees: Siemens Healthcare GmbH, Erlangen (DE); Siemens Healthcare Limited, Camberley (GB)

( * ) Notice: Subject to any disclaimer, the term of this patent is extended or adjusted under 35 U.S.C. 154(b) by 351 days.

(21) Appl. No.: 15/939,708

(22) Filed: Mar. 29, 2018

(65) Prior Publication Data

US 2019/0302204 A1 Oct. 3, 2019

(51) Int. Cl.
| | |
|---|---|
| *G01R 33/38* | (2006.01) |
| *F25D 19/00* | (2006.01) |
| *H01F 6/00* | (2006.01) |
| *H01F 6/04* | (2006.01) |
| *F25D 29/00* | (2006.01) |

(52) U.S. Cl.
CPC ....... *G01R 33/3804* (2013.01); *F25D 19/006* (2013.01); *F25D 29/001* (2013.01); *H01F 6/006* (2013.01); *H01F 6/04* (2013.01)

(58) Field of Classification Search
CPC ............ G01R 33/3804; G01R 33/3815; F25D 29/001; F25D 19/006; F25D 19/00; H01F 6/04; H01F 6/006; F25B 9/14
USPC ........................................................ 361/140
See application file for complete search history.

(56) References Cited

U.S. PATENT DOCUMENTS

| 9,810,755 | B2* | 11/2017 | Shen ................. G01R 33/3815 |
| 2015/0045226 | A1* | 2/2015 | Overweg ............... H01F 6/065 505/162 |
| 2017/0123025 | A1* | 5/2017 | Celik ................. G01R 33/3804 |

FOREIGN PATENT DOCUMENTS

CN 104865982 A 8/2015

* cited by examiner

*Primary Examiner* — Dharti H Patel
(74) *Attorney, Agent, or Firm* — Schiff Hardin LLP

(57) ABSTRACT

In a superconducting magnet arrangement, such as used in a magnetic resonance system, and a power management method therefor, an enhanced economic power mode (EPM) is implemented wherein the compressor operation is controlled by magnet pressure, temperature and time, so as to ensure the readiness of the magnet system for a scanning operation upon exiting the enhanced EPM. A processor implementing the enhanced EPM looks for a signal that indicates that the magnet system is operational and, in the absence of that signal for a predetermined period of time, enters into EPM. Exit from EPM occurs if certain conditions are violated, but then re-entry into EPM is attempted (re-starting EPM), thereby making the magnet system ready for operation again, if and when a patient scan is to be implemented.

15 Claims, 2 Drawing Sheets

POWER MANAGEMENT FOR CRYOGEN COMPRESSORS

BACKGROUND OF THE INVENTION

Field of the Invention

The present invention concerns helium-cooled superconducting magnets. In particular, such magnets employed in magnetic resonance imaging (MRI) systems, and more particularly, power control systems for minimizing the power consumption of a helium compressor employed in such magnets.

Description of the Prior Art

FIG. 1 shows a conventional helium-cooled superconducting magnet arrangement 1 as used in an MRI system. A cryogen vessel 12 is provided, and a cooled superconducting magnet 10 is provided within cryogen vessel 12, which is itself retained within an outer vacuum chamber (OVC) 14. One or more thermal radiation shields 16 are provided in the vacuum space between the cryogen vessel 12 and the outer vacuum chamber 14. In some known arrangements, a refrigerator 17 is mounted in a refrigerator sock 15 located in a turret 18 provided for the purpose, toward the side of the cryostat. Alternatively, a refrigerator 17 may be located within access turret 19, which retains access neck (vent tube) 20 mounted at the top of the cryostat. The refrigerator 17 provides active refrigeration to cool cryogen gas within the cryogen vessel 12, in some arrangements by recondensing it into a liquid. The refrigerator 17 may also serve to cool the radiation shield 16. The refrigerator is operated by compressed helium provided to it in a helium circuit as will be discussed below with reference to FIG. 2.

As illustrated in FIG. 1, the refrigerator 17 may be a two-stage refrigerator. A first cooling stage is thermally linked to the radiation shield 16, and provides cooling to a first temperature, typically in the range of 80-100K. A second cooling stage provides cooling of the cryogen gas to a much lower temperature, typically in the range of 4-10K.

FIG. 2 shows a typical magnet arrangement 1, for example as discussed with reference to FIG. 1, with a cryogenic refrigerator 17 providing cooling to the interior of the cryogen vessel. The refrigerator 17 is in a helium circuit that includes high pressure supply line 24, low pressure return line 26 and helium compressor 28.

An MRI system will have an MR data acquisition scanner that includes the magnet arrangement 1 and further equipment (not illustrated), such as gradient and field coils, shim coils and a patient table. One or more system electronics cabinet(s) 30 house(s) a magnet supervisory system 32 and other control and measurement equipment 34 which control operation of the magnet, and such further equipment, over communications lines 36. The magnet supervisory system 32 receives data input from appropriate system sensors attached to various components of the MRI system.

Helium compressor 28 is typically an electromechanical device. It is conventionally mechanically enclosed within the system electronics cabinet(s) 30 but the helium compressor is conventionally a standalone device.

A pressure heater 40, schematically shown in FIG. 2, is provided within the cryogen vessel. The magnet supervisory system 32 controls the provision of power to the pressure heater by controlling an electrical current to the heater. In operation, the pressure heater introduces heat to boil a proportion of the helium within the cryogen vessel and so to increase a pressure within the cryogen vessel.

In some known systems, both the cryogenic refrigerator and the pressure heater may, at times, be operating simultaneously. This represents a level of power consumption that it is desirable to reduce.

In use, unwanted thermal energy is introduced into the cryogen vessel mostly by actions related to patient examination operations e.g. gradient activity, eddy currents, and RF signals. Such unwanted thermal energy leads to temperature increase of the magnet's inner components. Another source of unwanted thermal energy is thermal radiation into the inner structure due to the large difference between the ambient temperature, generally around 300K, and the temperature of the helium-cooled magnet coils (around 4K). The unwanted thermal energy causes helium cryogen within the cryogen vessel to be transformed from liquid to gas, which leads to a pressure increase in the cryogen vessel. By cooling the helium gas within the cryogen vessel with coldhead 17, which is connected to helium compressor 28, the gaseous helium can be re-condensed into a liquid. As a consequence, the cryogen vessel pressure reduces and unwanted thermal energy is removed from the cryogen vessel.

In conventional systems, the cryogenic refrigerator may operate continuously, for 24 hours per day and 7 days a week. The cooling performance of the helium compressor and coldhead is designed to be able to re-condense gaseous helium even under intense system utilization, typically patient imaging.

Due to the continuous operation of the helium compressor and cold head, energy is consumed continuously. In times with low cooling demand the helium compressor and cold head provide more cooling performance than required, as their performance is typically not variable. During periods of low system utilization, typically when fewer patient imaging procedures are undertaken, for example at night or during weekends, the coldhead may provide excess cooling, which may reduce the cryogen vessel pressure to below the desired pressure range, which may risk air ingress. Such excess cooling may be counteracted by operation of pressure heater 40 within the cryostat. By combining the constant cooling performance of the coldhead with controlled operation of the pressure heater, the cryogen vessel pressure can be kept within a desired range under normal clinical system utilization. However, the simultaneous use of a coldhead and heater represents a wasteful use of energy.

In a known solution, an economic power mode (EPM) is used with MR systems. In the economic power mode, the helium compressor is switched on and off dependent on the pressure of cryogen gas within the cryogen vessel (referred to herein as "cryogen vessel pressure"). Magnet supervisory system 32 monitors system usage and cryogen vessel pressure and determines whether the economic power mode can be activated.

During activation of the economic power mode pressure heater 40 is deactivated while the helium compressor continues to run. When the cryogen vessel pressure reaches a lower threshold, the helium compressor is switched off until the cryogen vessel pressure reaches an upper threshold. When that upper threshold pressure is reached, the helium compressor is switched on again and cools the cryogen until the cryogen vessel pressure again reaches the lower threshold value. This mode may be operated until the system control indicates that scanning operation is required. When a scanning operation is required, only then is the helium compressor operated continuously, so as to provide cooling to remove heat influx due to scanner operation. This known economic power mode of operation may offer an energy saving as compared to a more conventional arrangement described above in which the helium compressor is operated continuously. Examples of such economic power mode are described in Chinese patent application publication CN104865982A.

SUMMARY OF THE INVENTION

The present invention is based on the insight that this economic power mode to be unsuitable for some systems which are sensitive to thermal variations due to energy inductions and have relatively long recovery times.

Accordingly, an object of the present invention is to provide an improved power management scheme to further reduce the power consumption of a cryogenic refrigerator, and to avoid the need for the long recovery times encountered with conventional economic power modes.

This object is achieved in accordance with the present invention by providing an enhanced EPM wherein the compressor operation is controlled by magnet pressure, temperature and time, so as to ensure the readiness of the magnet system for a scanning operation upon exiting the enhanced EPM. The enhanced EPM according to the invention "looks for" a signal that indicates that the magnet system is operational and, in the absence of that signal for a predetermined period of time, enters into EPM. In accordance with the invention, an exit from EPM occurs if certain conditions are violated, but then re-entry into EPM is attempted (re-starting EPM), thereby making the magnet system ready for operation again, if and when a patient scan is to be implemented.

DESCRIPTION OF THE PREFERRED EMBODIMENTS

Figure 1:
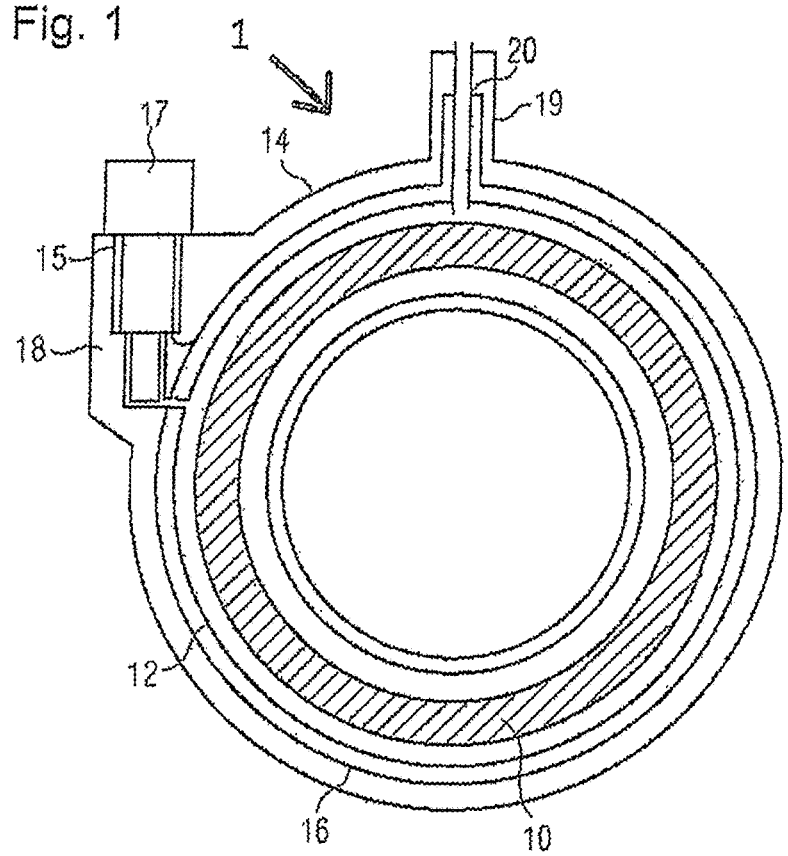
FIG. 1, as explained above, schematically illustrates a conventional helium-cooled superconducting magnet comprising a cryostat with cryogen vessel and cryogenic refrigerator.
Figure 2:
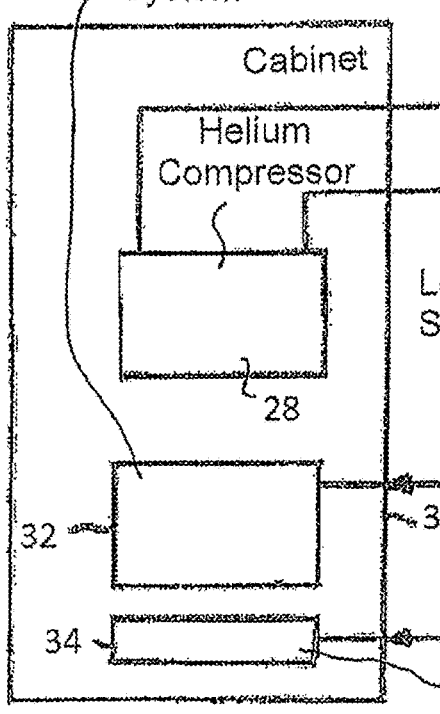
FIG. 2 schematically illustrates a magnet system including magnet supervisory system, helium compressor and some ancillary components.
Figure 2:
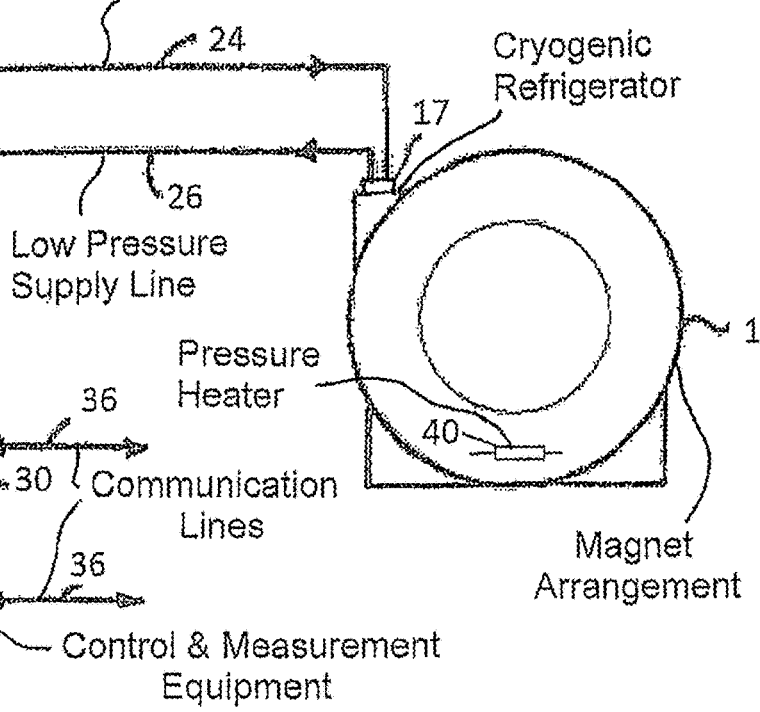

The enhanced EPM according to the invention operates a magnet arrangement 1, as shown in FIG. 1, by virtue of the enhanced EPM according to the invention being implemented by the magnet supervisory system 32. More specifically, the magnet supervisory system 32 includes, as its core, a processor (processing circuit) or a computer that is programmed in order to implement the method according to the invention. Less preferably, the magnet supervisory system 32 may include components that are hardwired in order to implement the method. The processor or computer of the magnet supervisory system 32 is programmed by programming instructions (program code) encoded on a non-transitory data storage medium, such as disc, a memory stick or the like. When the non-transitory storage medium is loaded into the magnet supervisory system 32, the programming instructions encoded on the non-transitory storage medium cause the magnet supervisory system 32 to implement all embodiments of the method according to the invention that are described below.

Figure 3:
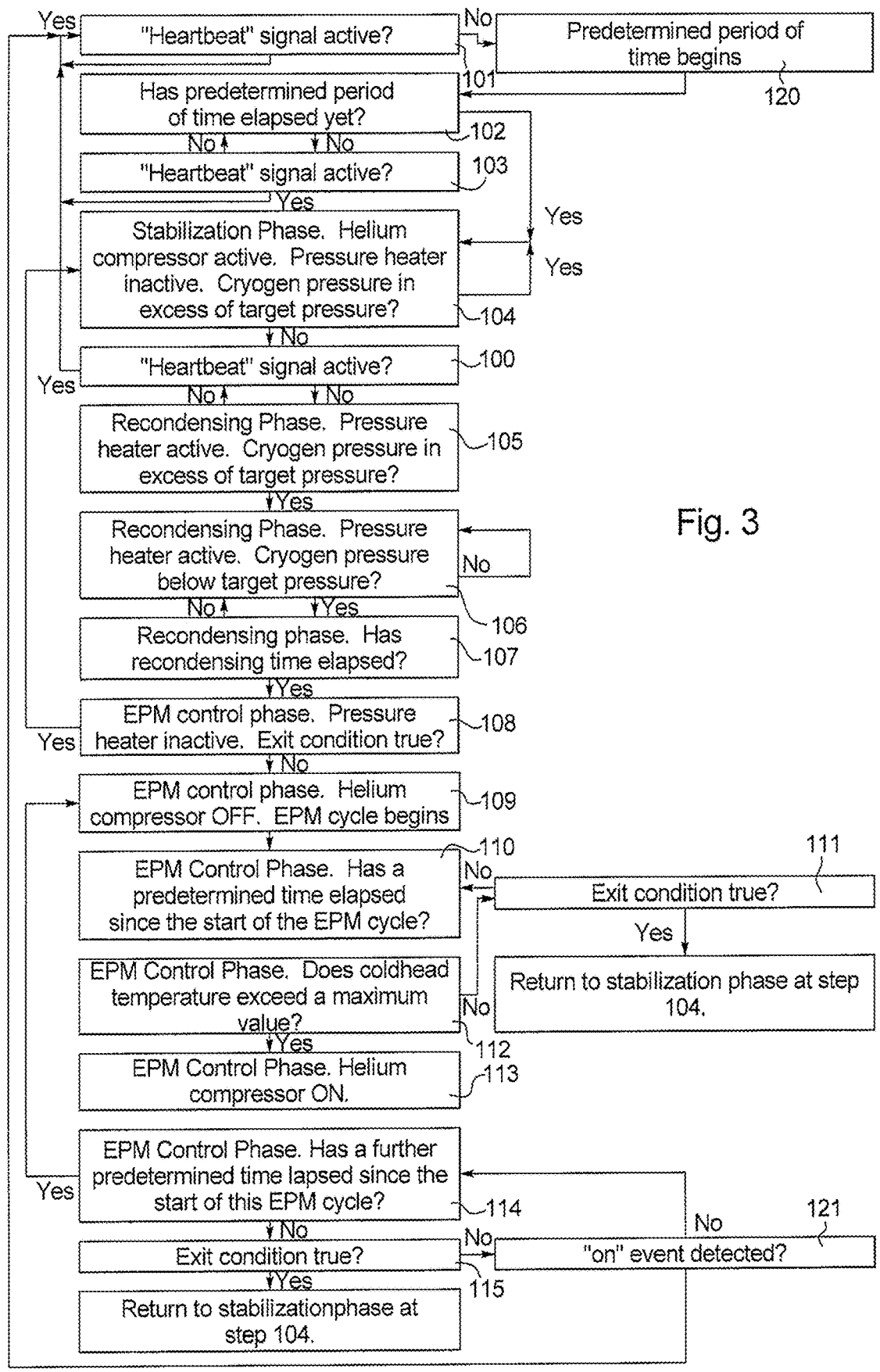
FIG. 3 is a flowchart illustrating an embodiment of the method of the present invention.

According to the embodiment of the method of the present invention illustrated in the flowchart of FIG. 3, the magnet supervisory system 32 detects when a predetermined period of time has elapsed since a "standby" or "system off" status began. This may be achieved by monitoring a signal indicating that the system is operational. Such signal may be referred to as a "heartbeat" signal.

The method of the present invention may be taken to commence at step 100, where the magnet supervisory system 32 establishes whether the predetermined heartbeat signal is active.

When a heartbeat signal is detected, the method moves on to step 101, where the magnet supervisory system 32 monitors the heartbeat signal. While the heartbeat signal is active, the method remains at step 101.

When the heartbeat signal ceases, the method moves on to a pair of steps 102, 103 where a timer determines, in step 102 whether the predetermined period of time has elapsed, and checks in step 103 whether the heartbeat signal has been re-established. If the heartbeat signal is re-established before the predetermined period of time has elapsed, the method returns to step 101. If the predetermined period of time has elapsed, the method moves on to step 104. The time-based EPM cycle ensures that the helium compressor is active for a certain minimum proportion of the time. However, by monitoring various exit conditions and coldhead temperature, the helium compressor may be active for a greater proportion of time than this minimum, if operating conditions so dictate. By monitoring the "on" event—for example, the presence of the "heartbeat" signal, the system is able to react with minimal delay to a requested return to operational imaging status.

The MRI system may include a measurement and reconstruction computer system, which is involved in performing imaging sequences and for then for constructing images from the acquired MR data. In such operation, a periodic CAN (Controller Area Network) signal is issued. That signal may be monitored by the magnet supervisory system 32 and interpreted as a heartbeat to indicate that the measurement and reconstruction system is operational. In other systems, other signals may be identified and monitored as heartbeat signals to indicate that an imaging sequence is on progress. When the heartbeat signal ceases, this is taken to indicate a "standby" or "system off" status.

Step 104 is reached when a "standby" or "system off" status has been present for the predetermined period of time, indicated by the absence of a heartbeat signal for that predetermined period of time. An algorithm is activated to determine whether to interrupt power to the helium compressor.

The algorithm operates in three distinct phases, as will be explained below:
1. Step 104—Stabilization phase: the helium compressor and, accordingly, also the coldhead, are operational. The pressure heater 40 is inactive. As cooling proceeds, pressure within the cryogen vessel 12 reduces. When the cryogen vessel pressure reaches a target value, the stabilization phase is completed. This phase takes only a few minutes under normal conditions. As long as the cryogen vessel pressure remains in excess of the target pressure, the method remains at step 104. Once the cryogen vessel pressure reduces to the target pressure, the stabilization phase is deemed complete, and the method moves to the next phase, here termed a recondensing phase, starting in step 105.

2. Recondensing phase: in this phase the system activates the pressure heater, in step 105, in order to regulate the cryogen vessel pressure at the target cryogen pressure for a defined recondensing time. If the cryogen pressure exceeds the target pressure, the method moves to step 106, still within the recondensing phase, but with the pressure heater inactive. The pressure heater remains inactive until the cryogen pressure exceeds the target pressure. Then, it is checked at step 107 whether the recondensing time has elapsed. If not, the method proceeds back to step 105. If the recondensing time has elapsed, the system enters a third phase, here termed an economic power mode (EPM) control phase beginning at step 108.

3. EPM control phase: this phase begins at step 108. If any of the defined exit conditions discussed above are true, then the system returns to the stabilization phase at step 104, as will be discussed in further detail below. A first EPM cycle begins at step 109. The helium compressor is deactivated. A timer step 110 ensures that the method waits for a certain time from the start of the EPM cycle. During that time, exit conditions are monitored by step 111. The coldhead temperature is also monitored during this time by step 112, to ensure that it remains below a maximum. If any of the defined exit conditions become true, the method returns to the stabilization phase at step 104. Once the coldhead temperature reaches the maximum, or the certain time elapsed since the start of the EPM cycle, the helium compressor is restarted in step 113. A timer step at 114 detects whether a further certain time has elapsed since the start of the EPM cycle. Exit conditions are monitored at step 115, and if any of the exit conditions become true, the method returns to the stabilization phase at 104. An "on" event may be detected at step 116. Such an "on" event may be the recommencement of the heartbeat signal, indicating that the system is required for imaging. If an "on" event is detected, the EPM control phase is abandoned, and the method returns to step 101. Once the further time has elapsed, measured by step 114, the method returns to step 109 and commences a new EPM cycle.

This EPM cycle 109-116 is repeated periodically at an interval of the further certain time until the system detects an "on" event or one of a number of exit conditions, for example:
cryogen vessel pressure low
cryogen pressure high
high temperature at a certain point within the magnet
low helium level
open circuit pressure sensor switch
coldhead disconnected.

An example EPM Cycle 109-116, discussed above, is a time-based cycle. In the above-described example, the EPM cycle is of a fixed duration of the further certain time. Other durations may of course be chosen within the scope of the present invention. The compressor switching on/off events, at steps 109 and 113, are thereby limited to a maximum number of cycles per hour.

At the beginning of each cycle, at step 109, the helium compressor and so accordingly also the coldhead are switched off until one of the following events is detected:
The certain time has elapsed, measured in step 110; or
The coldhead temperature reaches the maximum, measured in step 112;

As soon as one of the conditions occurs the compressor is switched on for the rest of the further certain time. The compressor on-time is therefore a minimum duration corresponding to the difference between the certain time and the further certain time.

If the EPM cycle discussed above ends for one of the exit conditions, for example:
cryogen vessel pressure low;
cryogen pressure high; or
high temperature at a certain point within the magnet,
then the system tries to re-enter into the cyclical EPM control phase as discussed above, by returning to the stabilization phase at 104. Before the EPM control phase can be re-entered the two preceding phases (stabilization phase and recondensing phase) are run through in order to bring the magnet back to a thermal and pressure equilibrium. This can take several hours.

In an exemplary embodiment, similar to the example discussed above, a power saving can be achieved by using the method of the present invention, as compared to a known method, yet without compromising the operational readiness of the MR System.

Activation of the power control method of the present invention is based on a single, simple criterion: the non-availability of the heartbeat. The power control method of the present invention may be adapted to operate with any time-based cycle, such as the EPM cycle discussed above. The power control method of the present invention regulates power consumption by the helium compressor, taking into account certain exit conditions, for example the cryogen vessel pressure, the coldhead temperature and the temperature of a predetermined part of the magnet, in the above example being the bore shield. The power control method of the invention ensures reduced power consumption yet ensures operational readiness of the MR system at all times, since the monitored temperatures and pressure are maintained within operational ranges at all times.

In the above-described example methods, steps for checking whether any of the exit conditions are true are provided at certain points, such as steps 111, 115, and detection of "on" events at step 121. However, preferably, exit conditions and "on" events are monitored continuously, so that reaction to a change in status can begin as soon as possible.

In certain embodiments, a re-entrant EPM mode is provided, explained above as the method returning to the stabilization phase of step 104 to re-enter into the cyclical EPM control phase 108 as discussed above. This improves the effectiveness of the power control method of the present invention, also over long runtimes, e.g. extended weekends. Excess power consumption is reduced by minimizing or eliminating use of the pressure heater while maintaining cryogen pressure and system temperature within operational ranges, ensuring that time is not lost in activating the system after an extended period of inactivity. These embodiments are carefully selected conditions that, if violated, cause the magnet supervisory system 32 to try to re-enter into EPM safely, i.e., without affecting the readiness of the MRI system for scanning.

Calculations show that use of the power control method of the present invention on a conventional helium compressor and cryogenic refrigerator may significantly reduce its power consumption.

In an alternative embodiment, a simple on/off control of the helium compressor, and so also of the coldhead, in steps 109 and 113 is replaced by a controlled variable cooling performance, for example by using a frequency modulator on the helium compressor. In this embodiment, the helium compressor cooling power is controlled by controlling an inverter frequency. Running the cold head at lower frequency results in less cooling and more power savings. With such a helium compressor with such inverter frequency control, it is possible to reduce the power consumption by controlling the inverter frequency actively during EPM.

Throughout this description, various references are made to helium gas, liquid, compressors and so on. While helium may be a useful cryogen in the applications envisaged by the present invention, the present invention applies to other cryogens too, and the term "helium" is used herein for ease of reading, except when the context indicates a specific reference to helium as such.

As noted above, with the enhanced EPM in accordance with the invention, the compressor operation is controlled by magnet pressure, temperature and time so as to ensure the readiness of the magnet system to exit EPM and enter into an operation mode if and when a scanning operation is to be implemented. Exiting the enhanced EPM occurs when certain selected conditions are violated, but then attempts are made to re-enter into the power saving mode. Operation returns to Step 104 in the event that an exit condition is determined to exist, followed by execution of steps 111 and 115.

Differences between a conventional EPM mode and the enhanced EPM mode according to the invention are summarized below.

| EPM Mode | Enhanced EPM mode |
| --- | --- |
| Magnet pressure based control for compressor operation. | Magnet pressure, Coldhead temperature and Time based control for compressor operation may be used in addition, or in the alternative. |
| EPM mode entry is possible only one time after system scan stop. | Enhanced EPM mode entry possible for multiple times after system scan stop. |
| Once pressure threshold or other EPM exit criteria violated during EPM mode then no re-entry possible to EPM mode. In summery only one EPM entry cycle possible after system scanning stop. | Once pressure or temperature or exit conditions violated during enhanced EPM mode then system temporarily comes out of EPM mode and tries to re-enter into EPM mode whenever system parameters allows. In summary, enhanced EPM mode is re-entrant. |
| Only one time power saving opportunity after scanning stop. | As long as there is no scanning, unlimited time power saving opportunities. |

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for power management of a superconducting magnet, comprising:
    in a computer in communication with a cryogen-cooled superconducting magnet, continuously detecting a presence of a predetermined signal from the superconducting magnet that indicates that the superconducting magnet is in a predetermined operating state, in which said superconducting magnet consumes power;
    when said predetermined signal is not detected by said computer for a predetermined time duration, automatically emitting at least one further signal from the computer to the superconducting magnet that places said superconducting magnet in a power-saving mode, which includes a power reduction phase in which said computer places said superconducting magnet in a power-saving state in which said superconducting magnet consumes less power than in said predetermined operating state;
    throughout said power-saving mode, monitoring, in said computer, a predetermined combination of pressure, temperature and operational times of at least one selected component of said superconducting magnet in order to detect if and when said combination satisfies a predetermined exit condition and, if said predetermined exit condition is detected in said computer, emitting further signals from said computer to said superconducting magnet that take said superconducting magnet out of said power-saving mode; and
    in said computer, after said superconducting magnet exits said power-saving mode, monitoring said superconducting magnet from said computer in order to detect an occurrence of predetermined re-entry conditions and automatically returning said superconducting magnet to said power-saving mode if said re-entry conditions are detected.

2. A method as claimed in claim 1 comprising, in said power-saving mode, providing signals from said computer to said superconducting magnet that initially place said superconducting magnet in a stabilization phase, before placing said superconducting magnet in said power reduction phase, in which said superconducting magnet is ready to rapidly return to said predetermined operational state if and when said exit condition is detected.

3. A method as claimed in claim 2 wherein said superconducting magnet comprises a cryogen vessel that contains a cryogen, a cryogen compressor that operates to place the cryogen at a cryogen pressure in said cryogen vessel, a coldhead in said cryogen vessel that operates to maintain the cryogen in a liquid state, and a pressure heater that operates to elevate a temperature of the cryogen in the cryogen vessel and wherein said method comprises:
    in said stabilization phase, emitting control signals from said computer that maintain said helium compressor and said coldhead operational, with said pressure heater being inactive, and detecting when said cryogen vessel pressure reaches a target pressure and maintaining said superconducting magnet in said stabilization phase as long as said cryogen vessel pressure exceeds said target pressure.

4. A method as claimed in claim 3 comprising, from said computer, operating said superconducting magnet in said power-saving mode in a recondensing phase between said stabilization phase and said power reduction phase and, during said recondensing phase, emitting control signals from said computer to said cryogen compressor and said pressure heater to regulate said cryogen vessel pressure with respect to said target pressure, while also monitoring, in said computer, a recondensing phase time duration and, if and when said recondensing phase time duration elapses, then operating said superconducting magnet from said computer in said power reduction phase.

5. A method as claimed in claim 4 comprising, in said power reduction phase, deactivating said cryogen compressor from said computer and monitoring a temperature of said coldhead, and restarting said cryogen compressor if said coldhead temperature exceeds a predetermined maximum value, or if a power reduction phase time duration has elapsed.

6. A computer for power management of a superconducting magnet, comprising:
a processor configured to communicate with a cryogen-cooled superconducting magnet, so as to continuously detect a presence of a predetermined signal from the superconducting magnet that indicates that the superconducting magnet is in a predetermined operating state, in which said superconducting magnet consumes power;
when said predetermined signal is not detected by said processor for a predetermined time duration, said processor being configured automatically emit at least one further signal from the computer to the superconducting magnet that places said superconducting magnet in a power-saving mode, which includes a power reduction phase in which said processor places said superconducting magnet in a power-saving state in which said superconducting magnet consumes less power than in said predetermined operating state;
throughout said power-saving mode, said processor being configured to monitor in said computer, a predetermined combination of pressure, temperature and operational times of at least one selected component of said superconducting magnet in order to detect if and when said combination satisfies a predetermined exit condition and, if said predetermined exit condition is detected in said processor, said processor being configured to emit further signals from said processor to said superconducting magnet that take said superconducting magnet out of said power-saving mode; and
said processor being configured, after said superconducting magnet exits said power-saving mode, to monitor said superconducting magnet in order to detect an occurrence of predetermined re-entry conditions and to automatically return said superconducting magnet to said power-saving mode if said re-entry conditions are detected.

7. A computer as claimed in claim 6 wherein said processor, in said power-saving mode, is configured to provide signals from said processor to said superconducting magnet that initially place said superconducting magnet in a stabilization phase, before placing said superconducting magnet in said power reduction phase, in which said superconducting magnet is ready to rapidly return to said predetermined operational state if and when said exit condition is detected.

8. A computer as claimed in claim 7 wherein said superconducting magnet comprises a cryogen vessel that contains a cryogen, a cryogen compressor that operates to place the cryogen at a cryogen pressure in said cryogen vessel, a coldhead in said cryogen vessel that operates to maintain the cryogen in a liquid state, and a pressure heater that operates to elevate a temperature of the cryogen in the cryogen vessel and wherein:
said processor is configured, in said stabilization phase, to emit control signals from said processor that maintain said helium compressor and said coldhead operational, with said pressure heater being inactive, and to detect when said cryogen vessel pressure reaches a target pressure and to maintain said superconducting magnet in said stabilization phase as long as said cryogen vessel pressure exceeds said target pressure.

9. A computer as claimed in claim 8 wherein said processor is configured to operate said superconducting magnet in said power-saving mode in a recondensing phase between said stabilization phase and said power reduction phase and, during said recondensing phase, to emit control signals from said processor to said cryogen compressor and said pressure heater to regulate said cryogen vessel pressure with respect to said target pressure, and to also monitor a recondensing phase time duration and, if and when said recondensing phase time duration elapses, to then operate said superconducting magnet from said computer in said power reduction phase.

10. A computer as claimed in claim 9 wherein said processor is configured, in said power reduction phase, to deactivate said cryogen compressor from said processor and to monitor a temperature of said coldhead, and to restart said cryogen compressor if said coldhead temperature exceeds a predetermined maximum value, or if a power reduction phase time duration has elapsed.

11. A superconducting magnet system, comprising:
a cryogen-cooled superconducting magnet;
a computer in communication with said cryogen-cooled superconducting magnet, said computer being configured to continuously detect a presence of a predetermined signal from the superconducting magnet that indicates that the superconducting magnet is in a predetermined operating state, in which said superconducting magnet consumes power;
when said predetermined signal is not detected by said computer for a predetermined time duration, said computer being configured to automatically emit at least one further signal from the computer to the superconducting magnet that places said superconducting magnet in a power-saving mode, which includes a power reduction phase in which said computer places said superconducting magnet in a power-saving state in which said superconducting magnet consumes less power than in said predetermined operating state;
throughout said power-saving mode, monitoring, in said computer, a predetermined combination of pressure, temperature and operational times of at least one selected component of said superconducting magnet in order to detect if and when said combination satisfies a predetermined exit condition and, if said predetermined exit condition is detected in said computer, emitting further signals from said computer to said superconducting magnet that take said superconducting magnet out of said power-saving mode; and
said computer being configured, after said superconducting magnet exits said power-saving mode, to monitor said superconducting magnet in order to detect an occurrence of predetermined re-entry conditions and to automatically return said superconducting magnet to said power-saving mode if said re-entry conditions are detected.

12. A superconducting magnet system as claimed in claim 11 wherein said computer is configured, in said power reduction mode, to provide signals from said computer to said superconducting magnet that initially place said superconducting magnet in a stabilization phase, before placing said superconducting magnet in said power reduction phase, in which said superconducting magnet is ready to rapidly return to said predetermined operational state if and when said exit condition is detected.

13. A superconducting magnet system as claimed in claim 12 wherein:

said superconducting magnet comprises a cryogen vessel that contains a cryogen, a cryogen compressor that operates to place the cryogen at a cryogen pressure in said cryogen vessel, a coldhead in said cryogen vessel that operates to maintain the cryogen in a liquid state, and a pressure heater that operates to elevate a temperature of the cryogen in the cryogen vessel; and said computer is configured, in said stabilization phase to emit control signals from said computer that maintain said helium compressor and said coldhead operational, with said pressure heater being inactive, and to detect when said cryogen vessel pressure reaches a target pressure and to maintain said superconducting magnet in said stabilization phase as long as said cryogen vessel pressure exceeds said target pressure.

14. A superconducting magnet system as claimed in claim 13 wherein said computer is configured to operate said superconducting magnet in said power-saving mode in a recondensing phase between said stabilization phase and said power reduction phase and, during said recondensing phase, to emit control signals from said computer to said cryogen compressor and said pressure heater to regulate said cryogen vessel pressure with respect to said target pressure, and to also monitor a recondensing phase time duration and, if and when said recondensing phase time duration elapses, to then operate said superconducting magnet from said computer in said power reduction phase.

15. A superconducting magnet system as claimed in claim 14 wherein said computer, in said power reduction phase, is configured to deactivate said cryogen compressor and monitor a temperature of said coldhead, and to restart said cryogen compressor if said coldhead temperature exceeds a predetermined maximum value, or if a power reduction phase time duration has elapsed.

* * * * *